United States Patent
Lee et al.

(10) Patent No.: US 9,515,638 B2
(45) Date of Patent: *Dec. 6, 2016

(54) BIPOLAR TRANSISTOR FREQUENCY DOUBLERS AT MILLIMETER-WAVE FREQUENCIES

(71) Applicant: INTERNATIONAL BUSINESS MACHINES CORPORATION, Armonk, NY (US)

(72) Inventors: Wooram Lee, Irvine, CA (US); Alberto Valdes Garcia, Hartsdale, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/617,468

(22) Filed: Feb. 9, 2015

(65) Prior Publication Data

US 2015/0155858 A1    Jun. 4, 2015

Related U.S. Application Data

(63) Continuation of application No. 13/747,915, filed on Jan. 23, 2013, now Pat. No. 9,036,761, which is a continuation of application No. 13/682,178, filed on Nov. 20, 2012, now Pat. No. 8,917,805.

(51) Int. Cl.
*H03B 19/14* (2006.01)
*H03K 5/00* (2006.01)

(52) U.S. Cl.
CPC .......... *H03K 5/00006* (2013.01); *H03B 19/14* (2013.01)

(58) Field of Classification Search
CPC .............................. H03B 19/14; H03B 19/00
USPC ......................................... 327/116, 119, 122
See application file for complete search history.

(56) References Cited

U.S. PATENT DOCUMENTS

| | | |
|---|---|---|
| 4,176,332 A | 11/1979 | Bachert |
| 4,518,931 A | 5/1985 | Rauscher |
| 6,066,997 A | 5/2000 | Matsugatani et al. |
| 6,985,702 B2 | 1/2006 | Hahn |
| 7,091,757 B2 | 8/2006 | Masuda |
| 7,256,646 B2 | 8/2007 | Eid et al. |
| 7,355,479 B2 | 4/2008 | Van Der Heijden |
| 7,508,264 B1 | 3/2009 | Terrovitis |
| 7,596,364 B2 | 9/2009 | Sjoland |
| 2007/0205844 A1 | 9/2007 | Zirath |

(Continued)

OTHER PUBLICATIONS

Borg, M., et al. "Novel MIC Bipolar Frequency Doublers Having High Gain, Wide Bandwidth and Good Spectral Performance" IEEE Transactions on Microwave Theory and Techniques, vol. 39, No. 12. Dec. 1991. pp. 1936-1946.

(Continued)

*Primary Examiner* — Kevin Kim
(74) *Attorney, Agent, or Firm* — Tutunjian & Bitetto, P.C.; Vazken Alexanian

(57) ABSTRACT

Methods for frequency multiplying include receiving a signal having an input frequency at a frequency multiplier comprising a pair of transistors; and selecting a harmonic in the signal by connecting the transistors to a common impedance through a respective collector impedance, wherein an output frequency at the harmonic between the collector impedances and the common impedance is an even integer multiple of an input frequency.

15 Claims, 12 Drawing Sheets

(56) References Cited

U.S. PATENT DOCUMENTS

| | | |
|---|---|---|
| 2011/0095792 A1 | 4/2011 | Bao |
| 2011/0102093 A1 | 5/2011 | El Rai et al. |
| 2011/0175651 A1 | 7/2011 | Chang et al. |
| 2011/0215844 A1 | 9/2011 | Trotta et al. |

OTHER PUBLICATIONS

Hung, J., et al. "High-Power High-Efficiency SIGE KU- and KA-Band Balanced Frequency Doublers" IEEE Transactions on Microwave Theory and Techniques, vol. 53, No. 2. Feb. 2005. pp. 754-761.

Kuo, N., et al. "A 60-GHz Frequency Tripler With Gain and Dynamic-Range Enhancement" IEEE Transactions on Microwave Theory and Techniques, vol. 59, No. 3. Mar. 2011. pp. 660-671.

Thomas, D., et al. "Optimization of Active Microwave Frequency Multiplier Performance Utilizing Harmonic Terminating Impedances" IEEE Transactions on Microwave Theory and Techniques, vol. 44, No. 12. Dec. 1996. pp. 2617-2624.

Wang, L., et al. "Millimeter-Wave Frequency Doubler With Transistor Grounded-Shielding Structure in 0.13-UM SIGE BICMOS Technology" IEEE Transactions on Microwave Theory and Techniques, vol. 59, No. 5. May 2011. pp. 1304-1310.

Yuk, K., et al. "High Power, High Conversion Gain Frequency Doublers Using SIC MESFETS and AlGaN/GaN HEMTS" Microwave Symposium Digest (MTT), 2010 IEEE MTT-S International, May 2010. (4 Pages).

"List of IBM Patents or Patent Applications Treated as Related".

$I_c$ (mA)  Time (ps)  $V_c$ (V)

BIPOLAR TRANSISTOR FREQUENCY DOUBLERS AT MILLIMETER-WAVE FREQUENCIES

RELATED APPLICATION INFORMATION

This application is a Continuation application of copending U.S. patent application Ser. No. 13/747,915 filed on Jan. 23, 2013, which in turn is a Continuation application of U.S. Pat. No. 8,917,805 filed on Nov. 20, 2012. Both are incorporated herein by reference in their entirety.

BACKGROUND

Technical Field

The present invention relates to frequency multipliers and, in particular, to frequency multipliers operating at millimeter wave frequencies.

Description of the Related Art

Frequency doublers and frequency multipliers in general are components of millimeter wave (mm Wave) data communication, radar and imaging systems. In any semiconductor technology, direct signal generation through an oscillator becomes more difficult as the fundamental frequency increases. High frequency oscillators tend to have lower tuning range, higher phase noise, higher power consumption and decreased robustness against temperature and other environmental variations than oscillators generating low frequencies. For these reasons, to generate a given frequency in the mm Wave regime, a common alternative is to employ a robust oscillator at a moderate frequency followed by a frequency multiplier.

Conventional frequency doublers use two transistors driven with a differential signal at a fundamental frequency w and a common load $Z_L$. The current at the second harmonic, having a frequency of 2w, has two components. The first is the second harmonic of the current generated by each transistor. While the current generated at the fundamental frequency has an opposite phase for each transistor and cancels out, the current at the second harmonic has the same phase from each transistor, and hence adds coherently. To enhance this component, transistors are usually biased below their threshold voltage, where their response is non-linear. This enhances harmonic generation but reduces operation speed and saturated output power. The second component comes from the fact that the output voltage swings twice for every cycle of the differential input signal. However, in a conventional frequency doubler, the output impedance at the fundamental frequency is a short, which makes the voltage swing at collector nodes small. This small swing at the collector prevents transistors from generating high power at high efficiency.

Conventional frequency doublers therefore rely on the constructive addition of the two above-described components. However, this constructive addition only occurs for a limited range of input powers. Furthermore, the range and the associated conversion gain are vulnerable to device and temperature variations, which affect the threshold voltage and hence the device's non-linearity.

SUMMARY

A method for frequency multiplying is shown that includes receiving a signal having an input frequency at a frequency multiplier comprising a pair of transistors; and selecting a harmonic in the signal by connecting the transistors to a common impedance through a respective collector impedance, wherein an output frequency at the harmonic between the collector impedances and the common impedance is an even integer multiple of an input frequency.

These and other features and advantages will become apparent from the following detailed description of illustrative embodiments thereof, which is to be read in connection with the accompanying drawings.

BRIEF DESCRIPTION OF DRAWINGS

The disclosure will provide details in the following description of preferred embodiments with reference to the following figures wherein.

DETAILED DESCRIPTION OF PREFERRED EMBODIMENTS

The present principles provide frequency doublers which have higher gain, saturation power, and efficiency compared to conventional frequency doublers. The embodiments disclosed herein furthermore are more robust to temperature changes, as current shaping is provided by collector voltage swing rather than from base voltage clipping determined by DC bias and the threshold voltage. To achieve these effects, the present principles employ current shaping with collector load, optimum harmonic termination at the input, and input capacitance neutralization.

Figure 1:
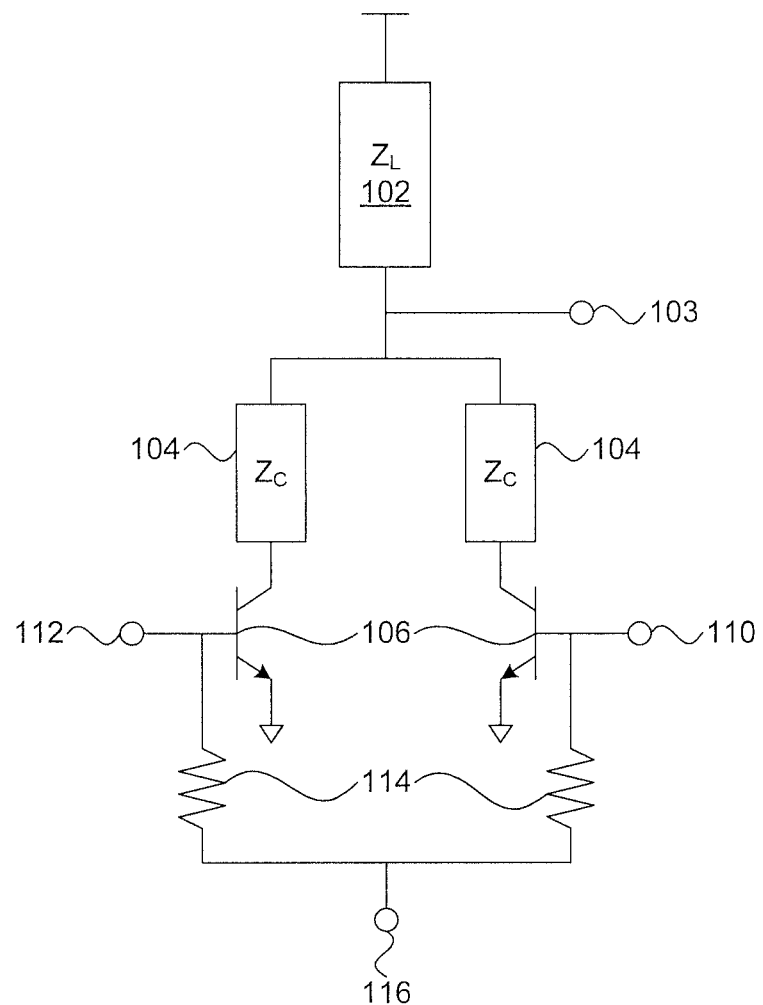
FIG. 1 is a diagram of a frequency multiplier according to the present principles.

Referring now to the drawings in which like numerals represent the same or similar elements and initially to FIG. 1, a frequency doubler is shown according to the present principles. A common load $Z_L$ 102 is shown, with an output voltage at 103 having a doubled frequency of 2w. Two input terminals are present, having a positive voltage input 112 and a negative voltage input 110, each having a fundamental frequency of w. Impedances $Z_c$ 104 at the collectors of transistors 106 are formed using, e.g., a transmission line having a length of approximately one quarter the wavelength of the input frequency w, giving a high collector impedance at the fundamental frequency. In this way, the collector impedances 104 modulate the collector current by having a large voltage swing at the collector. A bias voltage 116 is applied to the base of the transistors 106 through resistors 114 to bias the transistors 106 at the optimum point to maximize harmonic generation. The resistance value of resistors 114 should be much larger than the input impedance of transistors 106, so as not to affect AC operation.

This produces two results: First, the second harmonic content of the collector current will be larger at relatively high input amplitudes and, second, the overall power dissipated at the device—the product of the collector current and the collector voltage—will be lower because both voltage and current exhibit a switching behavior and do not overlap in time domain. Because in this mode of operation the second harmonic generation depends on the collector current shaping rather than on transconductance non-linearity, the $V_B$ terminal 116 can be higher than the threshold voltage of the transistors 106; this increases the gain of the device at high frequencies thus providing higher frequency doubler conversion gain and efficiency. For the second harmonic at 2w, the exemplary transmission line collector impedances 104 have about half the wavelength and are therefore transparent. In other words, the second harmonic current directly sees the impedance $Z_L$.

Described in general terms, the present principles provide a relatively large impedance 104 at the collector of each transistor 106 instead of a direct short. This creates a significant collector voltage waveform which has the fundamental frequency as its main component, but has other harmonics as well. Because the two transistors 106 are driven differentially, the fundamental component is always cancelled, whereas the harmonics may prevail. The large signal swing at the collector boosts efficiency because, for significant periods of time, the voltage drop across transistors 106 will be low. The large impedance 104 may be implemented, as described above, as a transmission line. As the length of the transmission line decreases, the overall collector voltage swing reduces as well, but the shape and overall phase difference between current and voltage may be such that other harmonics ($2^{nd}$, $4^{th}$, $6^{th}$, etc.) are generated efficiently.

It is to be understood that the present invention will be described in terms of a given illustrative architecture having a substrate or flexible substrate; however, other architectures, structures, substrate materials and process features and steps may be varied within the scope of the present invention.

It will also be understood that when an element such as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Embodiments in accordance with the present principles may include a design for an integrated circuit chip, which may be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer may transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein may be used in the fabrication of integrated circuit chips. The resulting integrated circuit chips can be distributed by the fabricator in raw form (that is, as a single flexible substrate that has multiple structures formed thereon), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Figure 2:
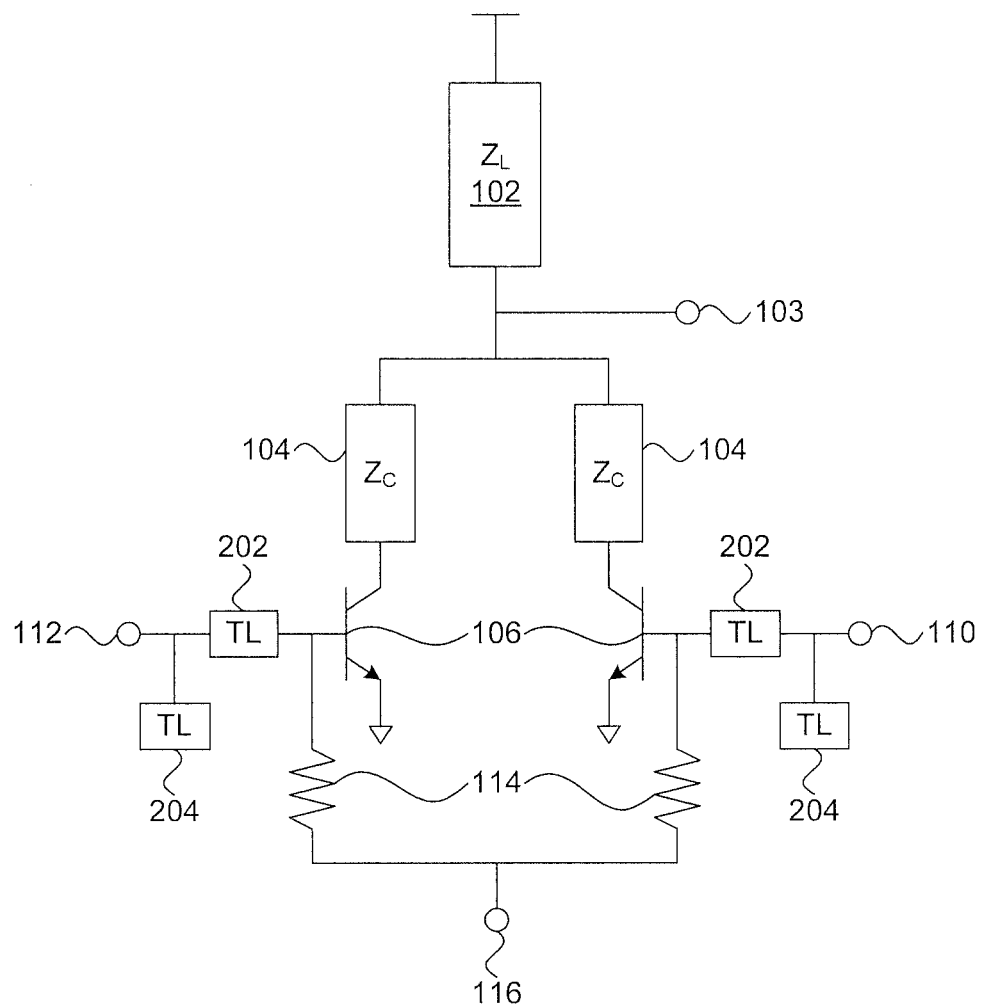
FIG. 2 is a diagram of a frequency multiplier with feedback reflection according to the present principles.

Referring now to FIG. 2, harmonic termination is shown at the inputs of transistors 106. Due to parasitic capacitances between collector and base, there may be signal feedback at the second harmonic between the output and the input of the transistors 106. This can be addressed by adding impedances 202 and 204 that represent a "short" at the second harmonic after a certain amount of phase shift through 202. Impedance 204 may be implemented using, e.g., a transmission line having a length that corresponds to one quarter of the wavelength at 2w and has an open end, thus behaving as a short. This reflects any signal at 2w that comes into impedance 204. The present embodiment also provides a second impedance 202, which may be implemented using a transmission line between the input to the transistor 106 and the short 204. The optimal length of 202 can be determined so that a reflected 2w signal from impedance 204 can experience a desired amount of phase shift for constructive interference with the existing second harmonic components before the signal reaches the base of transistor 106. Impedances 202 and 204 provide feedback in the second harmonic in such a way that it adds constructively with the harmonic content generated by the rest of the structure. This is in contrast to conventional frequency doublers, which would try to prevent current feedback from the collector-base capacitor from being converted into voltage at the base. In other words, whereas a conventional frequency doubler attempts to cancel feedback, the present invention uses such feedback constructively.

Figure 3:
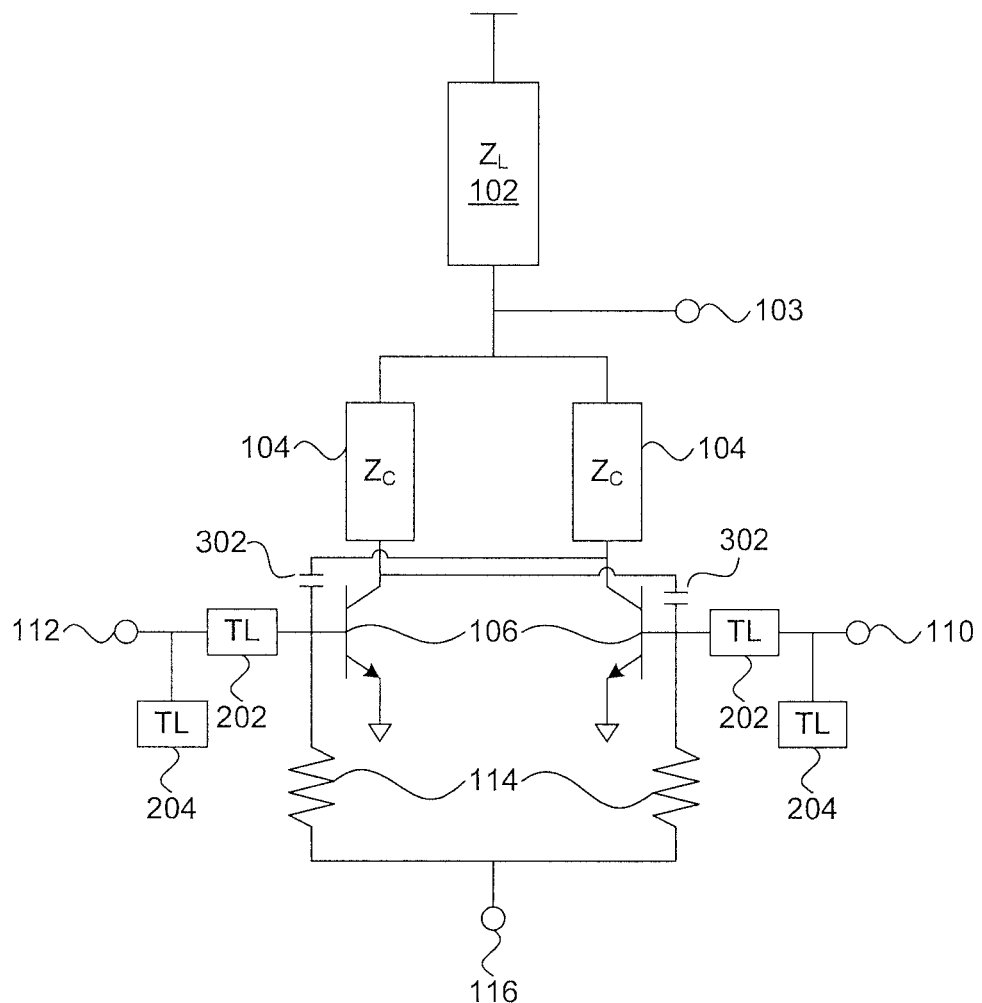
FIG. 3 is a diagram of a frequency multiplier with capacitance neutralization according to the present principles.

Referring now to FIG. 3, input capacitance neutralization is shown. Due to a high gain at the fundamental frequency w, a parasitic capacitance due to the Miller effect dominates the total input capacitance. The Miller effect depends on the input power, because at some point the gain at the fundamental frequency w compresses. Therefore, different input matching is used to obtain efficient operation at different power levels. In the present embodiment, neutralization capacitors 302 are connected between the input of each transistor 106 and connected to the collector of the other transistor 106. The neutralization capacitors 302 compensate for the feedback capacitance of transistors 106. As a result, the circuit exhibits a relatively constant input capacitance at different power levels. This is particularly beneficial at relatively low input powers, where higher conversion gains can be obtained using input capacitance neutralization.

Figure 4:
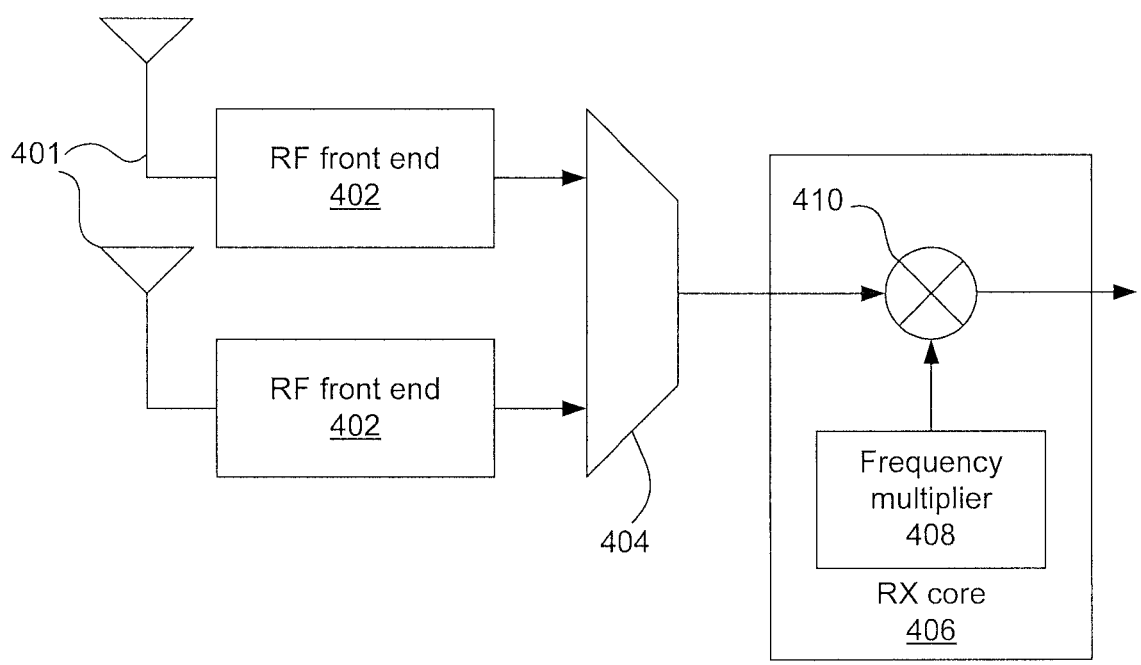
FIG. 4 is a diagram of a receiver with a frequency multiplier according to the present principles.

Referring now to FIG. 4, an exemplary mm Wave receiver is shown that illustrates how a frequency doubler may be used. The receiver 400 has multiple antennas 401, each leading to a respective radio frequency front end 402 that performs initial reception and processing. The power outputs of each front end 402 are combined in a power combiner 404, which sends its output to receiver core 406. The receiver core 406 performs additional processing, but first down-converts the input signal to an intermediate frequency (IF). To accomplish this, a frequency multiplier 408 generates a signal according to the present principles that is mixed with the input signal at mixer 410, producing a multiplied signal.

A frequency doubler can also be employed in a phased-array transmitter. In this case, the doubler drives an up-conversion mixer which converts the signal to be transmitted from IF to RF. Subsequently the RF is distributed to multiple RF front-ends.

Figure 5A:
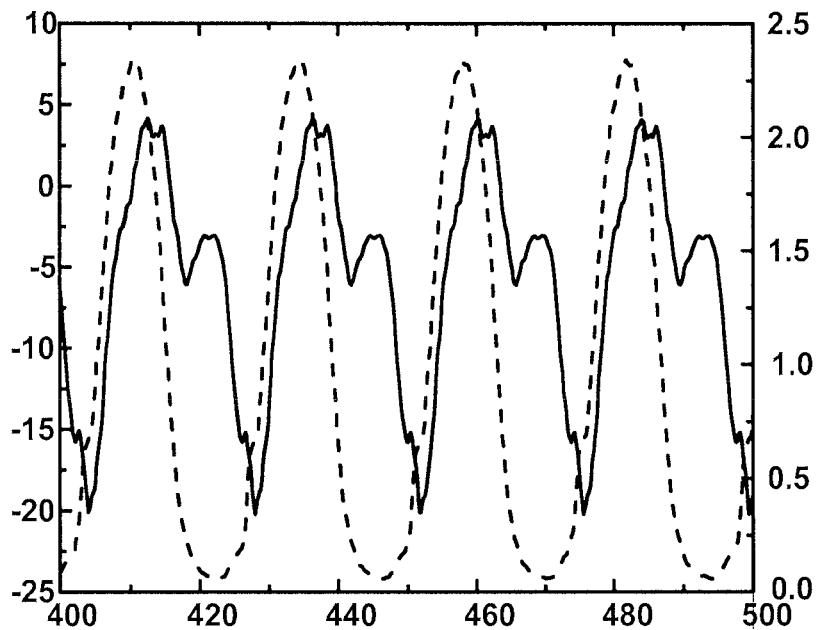
FIG. 5(a) is a graph showing current in a frequency multiplier without collector impedances.
Figure 5B:
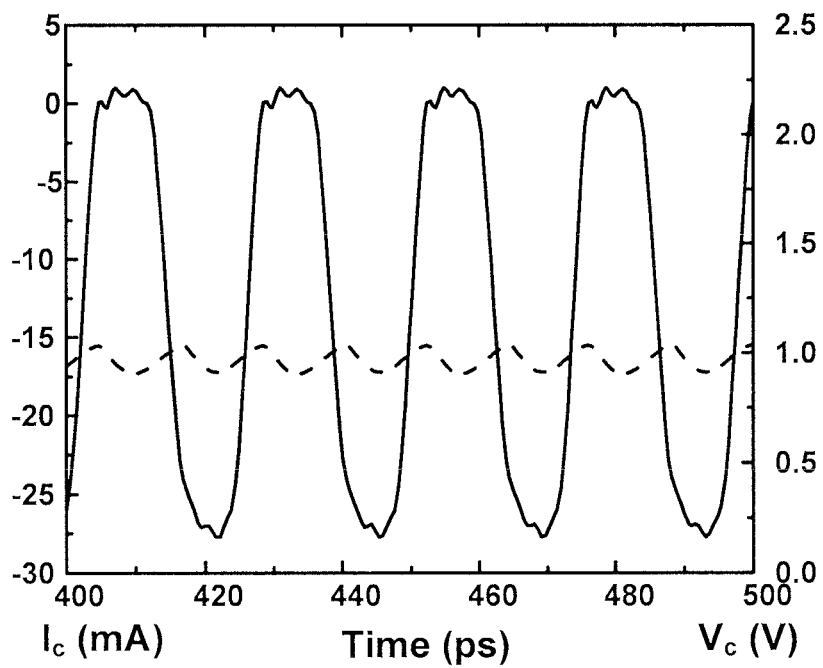
FIG. 5(b) is a graph showing current in a frequency multiplier according to the present principles.

Referring now to FIG. 5, graphs are shown that compare embodiments with (a) and without (b) the collector impedances 104. In each graph, a solid line shows the current at the collector of transistors 106, measured in milliamps, while a dotted line shows the voltage at the collector, measured in volts. FIG. 5(a) clearly shows a much more pronounced second harmonic that causes the depicted two-hump structure of the waveform. In contrast, the 5(b) graph has a much smoother curve that lacks pronounced second harmonic effects. Furthermore, the collector impedances 104 cause a substantially increased voltage swing at the collector in graph 5(a) as compared to graph 5(b). The high voltage swing allows the use of power-efficient operation.

Figure 6:
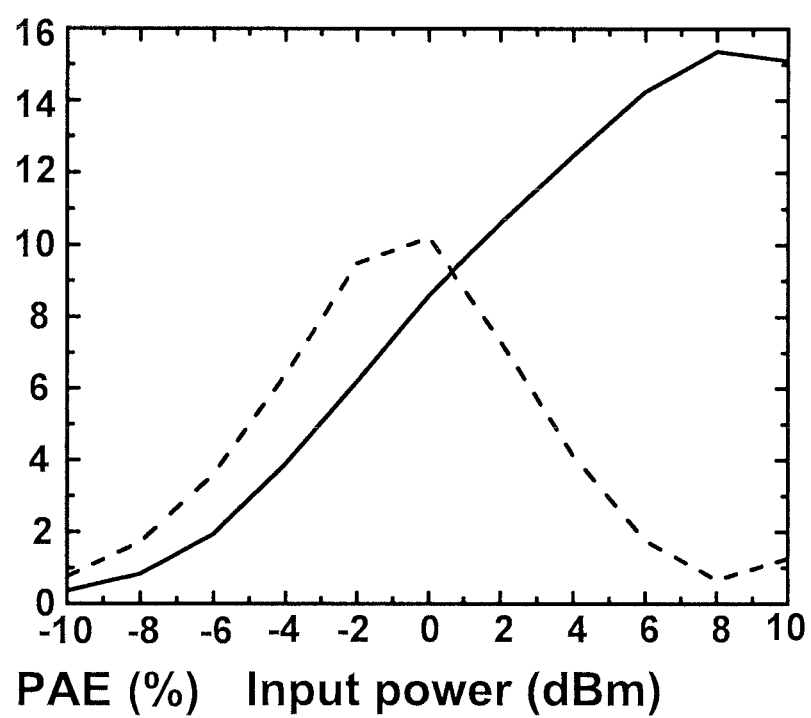
FIG. 6 is a graph comparing the power added efficiency of embodiments with and without collector impedances.

Referring now to FIG. 6, the power added efficiency (PAE) of the present embodiments with collector impedances 104 and without neutralization capacitors 302 are shown in comparison to conventional frequency doublers. The PAE is measured against the input power. The input power is measured in decibels with a reference of one milliwatt (dBm) and PAE is measured in percentage (%) as a ratio of output power at 2w to total input power including supplied DC and AC at w. A dotted line represents the PAE of conventional frequency doublers, while the solid line represents the PAE of the present embodiments. As is evident from the graph, the present embodiments provide much higher efficiencies at higher powers. Moreover, in the present embodiment, lower efficiency at low input power can be improved by using neutralization capacitors 302 as shown in FIG. 8 and as described below.

Figure 7A:
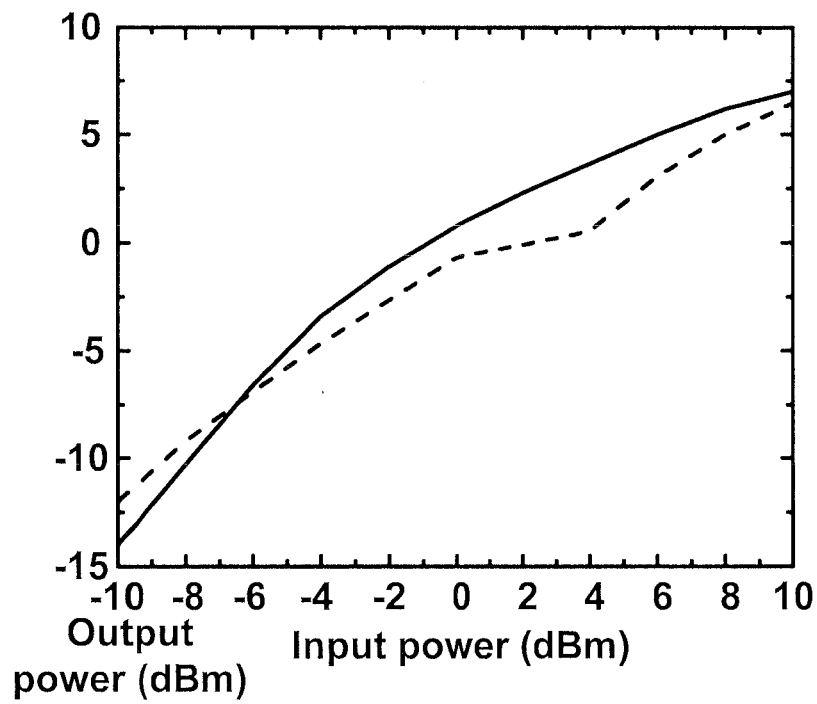
FIG. 7(a) is a graph of temperature response of a frequency doubler according to the present principles.
Figure 7B:
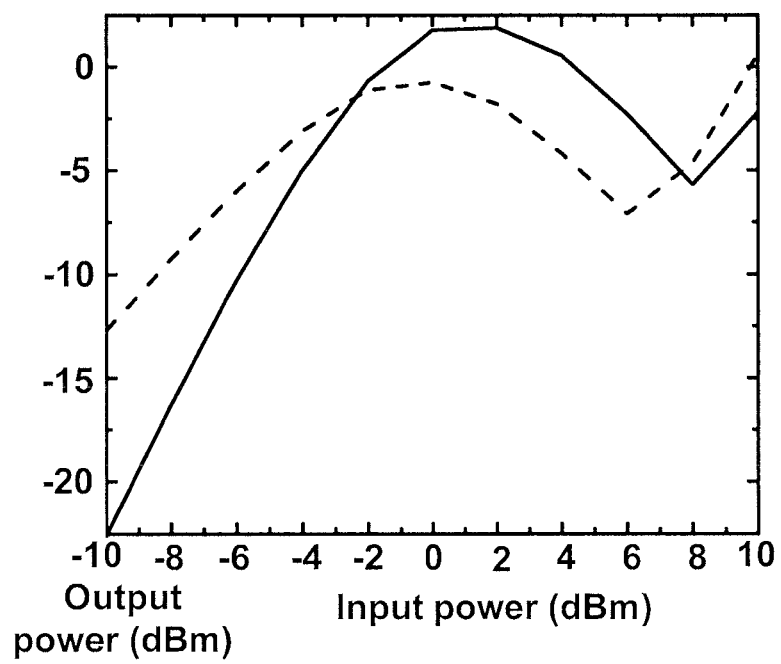
FIG. 7(b) is a graph of temperature response of a conventional frequency doubler.

Referring now to FIG. 7, the temperature response of the present embodiments (a) is compared to the temperature response of conventional frequency doublers (b). In each case, the output power is measured in decibels and compared to input power, measured in decibels. A dotted line shows the power response as measured at 27 degrees Celsius, while a dotted line shows the same device measured at 85 degrees Celsius, both at a fundamental frequency of w=42 GHz. The two curves track closely in the present embodiment, showing robustness against significant changes in temperature, while conventional frequency doublers show substantial divergence under the same temperatures.

Figure 8:
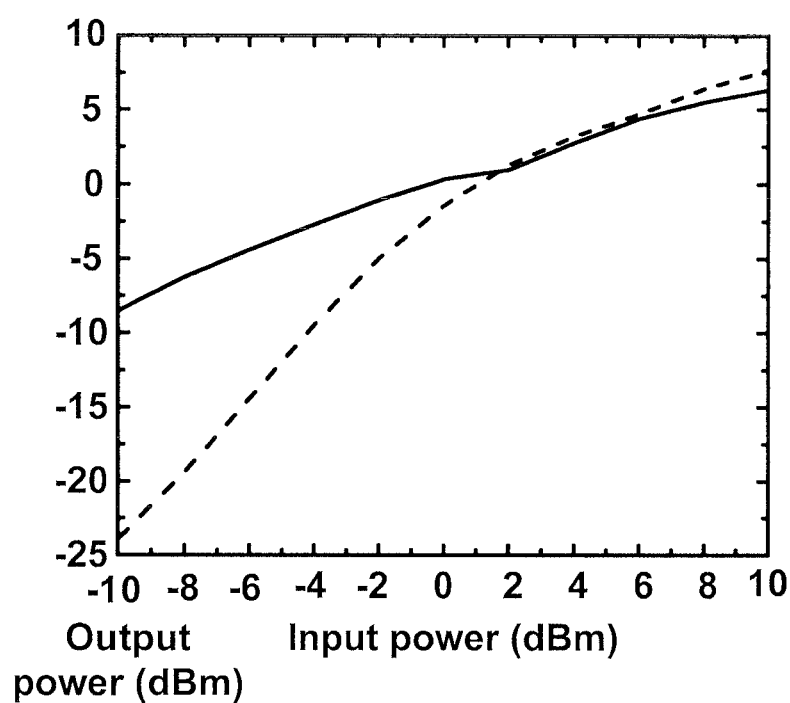
FIG. 8 is a graph comparing the output power of frequency multipliers according to the present principles with and without neutralization capacitors.

Referring now to FIG. 8, a comparison between the present embodiments with neutralization capacitors 302 and the embodiments without neutralization capacitors 302. The output power is measured in decibels and shown against input power, also measured in decibels. A solid line shows the results of a device using a neutralization capacitor 302 having a capacitance of 10 fF, while the dashed line shows the response of the present embodiments without neutralization. The graph shows that neutralization capacitors 302 provide better input matching for a broad range of input powers by cancelling out the parasitic feedback capacitance.

Figure 9:
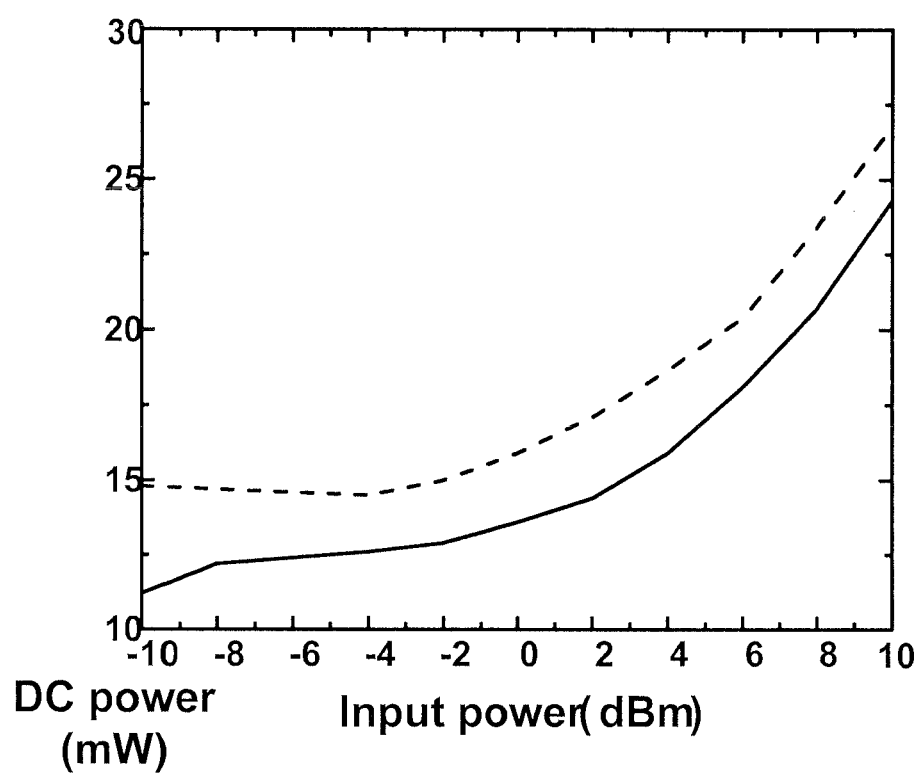
FIG. 9 is a graph comparing power consumption of frequency multipliers according to the present principles with and without neutralization capacitors.

Referring now to FIG. 9, a comparison of DC power consumption is shown. DC power consumption is measured in milliwatts against input power, measured in decibels. A solid line shows the power consumption of an embodiment having neutralization capacitors 302, while a dashed line shows power consumption for the present embodiment without neutralization capacitors 302. As can be seen from the graph, the power consumption of a neutralized frequency doubler is substantially lower than that of conventional designs.

It should be recognized that the present principles may be extended to embodiments providing greater frequency multipliers. Even frequency multipliers greater than two can be implemented by adjusting a collector impedance to have a different phase relation between voltage and current at the output. A different phase shift changes the portion of harmonics by having a different current waveform in time domain. For example, a narrower current waveform has higher power at higher harmonics. Capacitance neutralization can be employed for any differential type of even-numbered frequency multipliers to improve conversion gain at low input power. The present principles do not provide for odd-numbered multipliers, because any even harmonic adds constructively at the common impedance 102 and all odd harmonics cancel.

Figure 10:
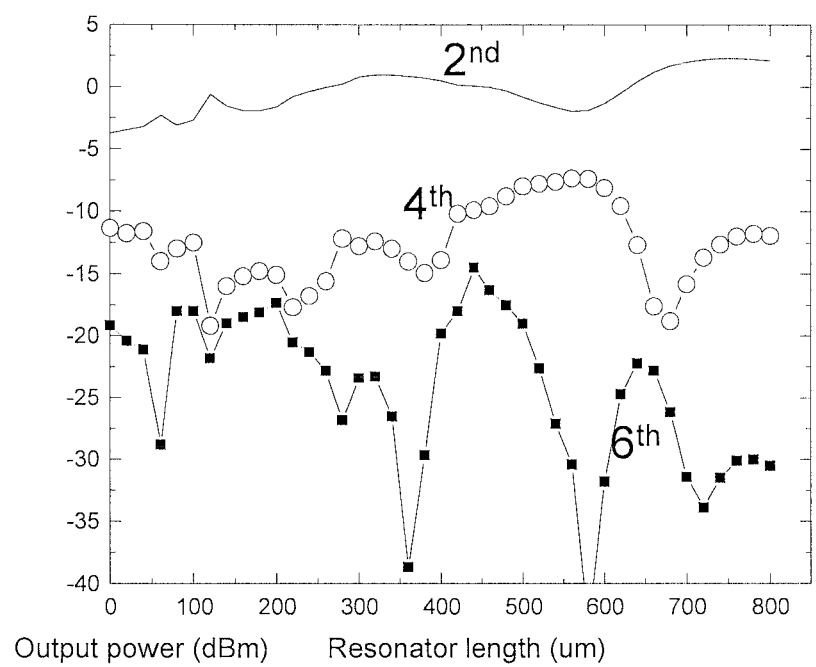
FIG. 10 is a graph showing a simulation of a frequency multiplier according to the present principles that exemplifies harmonic response according to resonator length.

Referring now to FIG. 10, a simulation is shown that displays output power from different even harmonics as a function of the length of a transmission line 104 at the collector of transistors 106. The second harmonic is shown as a solid line, with the fourth harmonic shown using hollow dots and the sixth harmonic shown using solid dots. The length of the transmission line 104 is shown in micrometers on the x-axis, with output power being shown on the y-axis. Transmission lines 104 having different loads produce different phase shifts between the collector voltage and current, resulting in different collector current waveforms in the time domain. For example, 550 μm is an optimal transmission line length to maximize the fourth harmonic to operate as a frequency quadrupler. Similarly, 720 μm is optimal for a frequency doubler, because the second harmonic is at a maximum.

In the simulation shown in FIG. 10, only the length of the collector transmission line 104 is varied, with everything else being held constant. When the transmission line is 550 μm, the $4^{th}$ harmonic increases but is still smaller than the second. To operate the circuit as a frequency quadrupler, where the $4^{th}$ harmonic is the largest tone, other modifications may be introduced.

Figure 11:
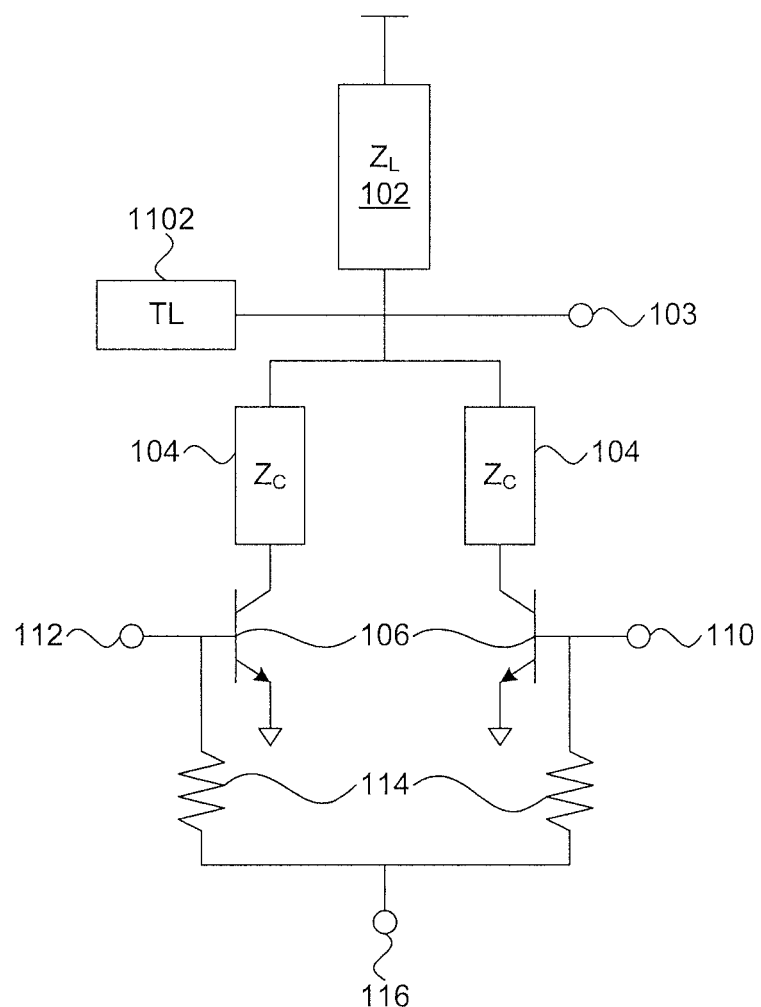
FIG. 11 is a diagram of a frequency quadrupler according to the present principles.

Referring now to FIG. 11, a frequency quadrupler is shown. A reflecting transmission line having a length that corresponds to about one quarter wavelength of a frequency-doubled input signal and having an open end is placed at the junction between the common impedance 102 and the collector impedances 104. The transmission line 1102 acts as a stub filter, removing the second harmonic. Because the total power generated by the multiplier should remain approximately constant, due to the conservation of energy, suppressing the second harmonic in turn enhances the energy of the fourth. The common impedance 102 in this case can be the final load impedance of the multiplier, such as an on-chip antenna.

Figure 12:
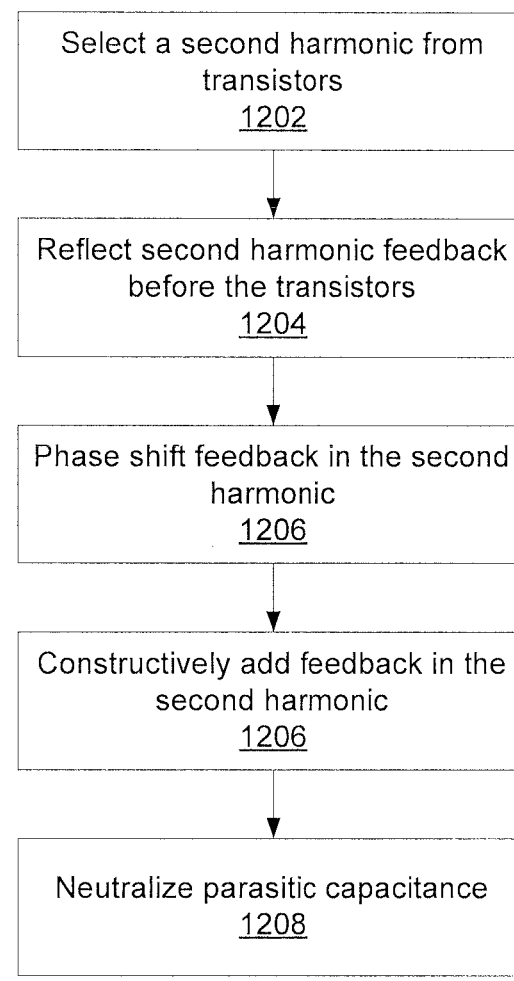
FIG. 12 is a block/flow diagram of a frequency multiplying method according to the present principles.

Referring now to FIG. 12, a method for multiplying an input frequency is shown. Block 1202 selects a second harmonic from transistors 106 using, e.g., transmission lines 104 as described above. These transmission lines 104 have a length that selectively emphasizes the second harmonic of the signal, producing a frequency-doubled signal. Block 1204 uses a reflecting transmission line 204 before the transistors 106 to reflect back any feedback in the second harmonic. Block 1206 phase shifts the reflected second harmonic using an appropriate transmission line 202 before block 1206 constructively adds the reflected second harmonic with the input signal. Block 1208 neutralizes the parasitic capacitance at transistors 106 by implementing neutralizing capacitors between the transistors 106.

Reference in the specification to "embodiments," "one embodiment," or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This may be extended, as readily apparent by one of ordinary skill in this and related arts, for as many items listed.

Having described preferred embodiments of a system and method for frequency doubling with bipolar transistor frequency doublers at millimeter-wave frequencies (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:
1. A method for frequency multiplying, comprising:
   receiving a signal having an input frequency at a frequency multiplier comprising a pair of transistors;
   selecting a harmonic in the signal by connecting the transistors to a common impedance through a respective collector impedance, wherein an output frequency at the harmonic between the collector impedances and the common impedance is an even integer multiple of an input frequency;
   reflecting second harmonic feedback in the input signal from the transistors; and
   phase shifting the reflected second harmonic feedback.

2. The method of claim 1, wherein the collector impedances are transmission lines having a length of about one quarter a wavelength of an input signal frequency.

3. The method of claim 2, wherein the output frequency is about double the input frequency.

4. The method of claim 1, wherein the output frequency is about quadruple the input frequency.

5. The method of claim 1, wherein said reflecting is performed using a pair of reflecting transmission lines having a length that corresponds to about one quarter wavelength of a frequency-doubled input signal and having an open end.

6. The method of claim 1, wherein said phase shifting is performed using a pair of phase shifting transmission lines, each connecting a base terminal of a transistor to a respective one of the pair of reflecting transmission lines, having a length that phase shifts a reflected signal from the reflecting transmission lines to add constructively with harmonic components of the input signal.

7. The method of claim 1, further comprising neutralizing parasitic capacitance using a pair of neutralization capacitors, each connecting the base terminal of a transistor to an opposite collector transmission line to compensate for feedback capacitance in the transistors.

8. The method of claim 1, wherein the received signal is provided to the pair transistors differentially, such that a fundamental component of the signal cancels out.

9. A method for frequency multiplying, comprising:
   receiving a signal having an input frequency at a frequency multiplier comprising a pair of transistors; and
   selecting a harmonic in the signal by connecting the transistors to a common impedance through a respective collector impedance, wherein an output frequency at the harmonic between the collector impedances and the common impedance is about quadruple the input frequency.

10. The method of claim 9, wherein the collector impedances are transmission lines having a length of about one quarter a wavelength of an input signal frequency.

11. The method of claim 9, further comprising:
   reflecting second harmonic feedback in the input signal from the transistors; and
   phase shifting the reflected second harmonic feedback.

12. The method of claim 11, wherein said reflecting is performed using a pair of reflecting transmission lines having a length that corresponds to about one quarter wavelength of a frequency-doubled input signal and having an open end.

13. The method of claim 11, wherein said phase shifting is performed using a pair of phase shifting transmission lines, each connecting a base terminal of a transistor to a respective one of the pair of reflecting transmission lines, having a length that phase shifts a reflected signal from the reflecting transmission lines to add constructively with harmonic components of the input signal.

14. The method of claim 9, further comprising neutralizing parasitic capacitance using a pair of neutralization capacitors, each connecting the base terminal of a transistor to an opposite collector transmission line to compensate for feedback capacitance in the transistors.

15. The method of claim 9, wherein the received signal is provided to the pair transistors differentially, such that a fundamental component of the signal cancels out.

\* \* \* \* \*